United States Patent
Kuroyanagi et al.

(10) Patent No.: US 10,250,222 B2
(45) Date of Patent: Apr. 2, 2019

(54) ELECTRONIC DEVICE

(71) Applicant: TAIYO YUDEN CO., LTD., Tokyo (JP)

(72) Inventors: Takuma Kuroyanagi, Tokyo (JP); Kazushige Hatakeyama, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 118 days.

(21) Appl. No.: 15/430,818

(22) Filed: Feb. 13, 2017

(65) Prior Publication Data
US 2017/0250669 A1 Aug. 31, 2017

(30) Foreign Application Priority Data
Feb. 29, 2016 (JP) .................. 2016-037288

(51) Int. Cl.
*H03H 9/10* (2006.01)
*H03H 9/05* (2006.01)
*H03H 9/02* (2006.01)
*H03H 9/25* (2006.01)
(Continued)

(52) U.S. Cl.
CPC ............ *H03H 9/1071* (2013.01); *H03H 3/02* (2013.01); *H03H 3/08* (2013.01);
(Continued)

(58) Field of Classification Search
CPC ........ H03H 3/02; H03H 3/08; H03H 9/02559; H03H 9/02574; H03H 9/02992;
(Continued)

(56) References Cited

U.S. PATENT DOCUMENTS

| 4,803,449 A | 2/1989 | Hikita et al. |
| 5,438,305 A | 8/1995 | Hikita et al. |
(Continued)

FOREIGN PATENT DOCUMENTS

| JP | 2001345673 A | * 12/2001 |
| JP | 2004-71938 A | 3/2004 |
(Continued)

OTHER PUBLICATIONS

Machine English Translation of JP2001345673A Published on Dec. 14, 2001.*
(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An electronic device includes: a first substrate including a first functional element located on an upper surface of the first substrate; a second substrate that is flip-chip mounted on the upper surface of the first substrate through a bump, and includes a second functional element located on a lower surface of the second substrate; and a sealing member that is located on the upper surface of the first substrate, surrounds the second substrate in plan view, is not located between the first substrate and the second substrate, seals the first functional element and the second functional element so that the first functional element and the second functional element are located across an air gap.

11 Claims, 21 Drawing Sheets

(51) Int. Cl.
    *H03H 3/02* (2006.01)
    *H03H 3/08* (2006.01)
(52) U.S. Cl.
    CPC .... *H03H 9/02559* (2013.01); *H03H 9/02574* (2013.01); *H03H 9/02992* (2013.01); *H03H 9/059* (2013.01); *H03H 9/0547* (2013.01); *H03H 9/0571* (2013.01); *H03H 9/0576* (2013.01); *H03H 9/1007* (2013.01); *H03H 9/1014* (2013.01); *H03H 9/1064* (2013.01); *H03H 9/25* (2013.01); *H01L 2224/16225* (2013.01)
(58) Field of Classification Search
    CPC .. H03H 9/0547; H03H 9/0571; H03H 9/0576; H03H 9/059; H03H 9/1007; H03H 9/1064; H03H 9/1071; H03H 9/25; H03H 9/1014; H03H 9/1092; H01L 2224/16225
    USPC .................. 333/133, 187, 188, 193–196
    See application file for complete search history.

(56) References Cited

U.S. PATENT DOCUMENTS

| | | | |
|---|---|---|---|
| 7,274,129 B2 * | 9/2007 | Ueda | H03H 3/10 310/313 R |
| 2009/0224851 A1 | 9/2009 | Feiertag et al. | |
| 2015/0036304 A1 | 2/2015 | Yamauchi et al. | |

FOREIGN PATENT DOCUMENTS

| | | |
|---|---|---|
| JP | 2006-246112 A | 9/2006 |
| JP | 2008-546207 A | 12/2008 |
| JP | 2015-32634 A | 2/2015 |
| JP | 2015-91065 A | 5/2015 |
| JP | 2015-130601 A | 7/2015 |
| WO | 2014/17514 A1 | 1/2014 |

OTHER PUBLICATIONS

Japanese Office Action dated Mar. 13, 2018, in a counterpart Japanese patent application No. 2016-037288. (A machine translation (not reviewed for accuracy) attached.).

U.S. Appl. No. 15/451,684, filed Mar. 7, 2017.

"Alumina—Aluminium Oxide—A1203—A Refractory Ceramic Oxide", Azo Materials, https://www.azom.com/properties.aspx?ArticleID=52, accessed on Aug. 3, 2018 (Listed by the U.S. Examiner in a PTO-892 form in the related U.S. Appl. No. 15/451,684.).

"Lithium Tantalate (LiTaO3)", Korth Kristalle GMBH, https://www.korth.de/index.php/162/items/20.html, accessed on Aug. 3, 2018 (Listed by the U.S. Examiner in a PTO-892 form in the related U.S. Appl. No. 15/451,684.).

* cited by examiner

ELECTRONIC DEVICE

CROSS-REFERENCE TO RELATED APPLICATION

This application is based upon and claims the benefit of priority of the prior Japanese Patent Application No. 2016-037288, filed on Feb. 29, 2016, the entire contents of which are incorporated herein by reference.

FIELD

A certain aspect of the present invention relates to an electronic device.

BACKGROUND

As a packaging method of an electronic device such as an acoustic wave device, there has been known a method that face-down mounts a chip on a circuit board and covers the periphery of the chip with a sealing member. The integration and downsizing of the acoustic wave device have been desired. Japanese Patent Application Publication No. 2008-546207 describes that two substrates each including an acoustic wave element formed on the surface thereof are bonded together through an interlayer so that the acoustic wave elements face each other across an air gap.

In the method that stacks substrates each including a functional element such as an acoustic wave element formed thereon as disclosed in Japanese Patent Application Publication No. 2008-546207, the stress between the substrates becomes a problem. For example, the thermal stress between the substrates strains the substrates, deteriorating the characteristics of the functional elements.

SUMMARY OF THE INVENTION

According to an aspect of the present invention, there is provided an electronic device including: a first substrate including a first functional element located on an upper surface of the first substrate; a second substrate that is flip-chip mounted on the upper surface of the first substrate through a bump, and includes a second functional element located on a lower surface of the second substrate; and a sealing member that is located on the upper surface of the first substrate, surrounds the second substrate in plan view, is not located between the first substrate and the second substrate, seals the first functional element and the second functional element so that the first functional element and the second functional element are located across an air gap.

DETAILED DESCRIPTION

Hereinafter, embodiments of the present invention will be described with the accompanying drawings.

First Embodiment

Figure 1:
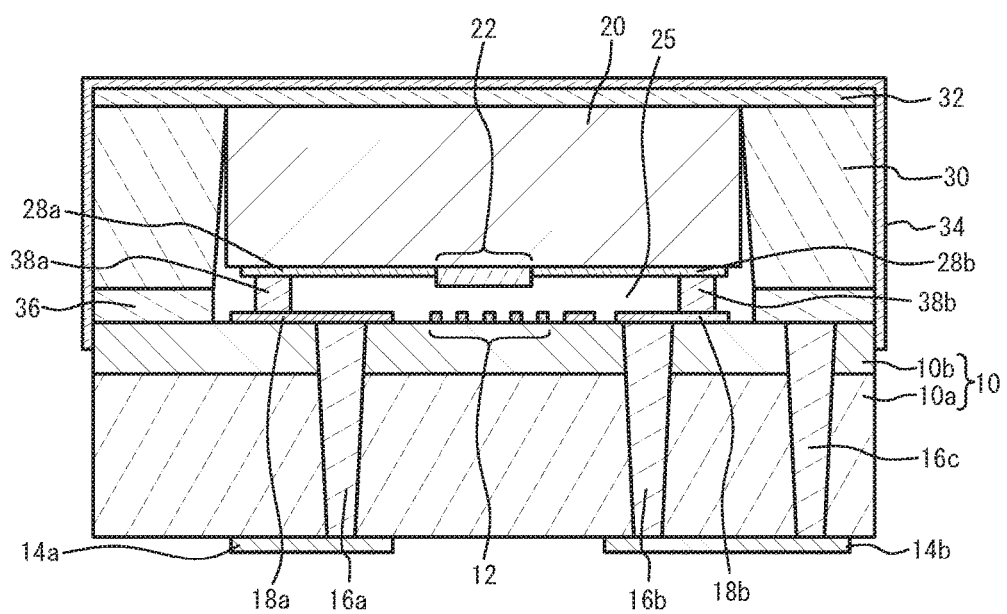
FIG. 1 is a cross-sectional view of an electronic device in accordance with a first embodiment.

FIG. 1 is a cross-sectional view of an electronic device in accordance with a first embodiment. As illustrated in FIG. 1, a substrate 10 includes a support substrate 10a and a piezoelectric substrate 10b. The support substrate 10a is, for example, a sapphire substrate, a spinel substrate, an alumina substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface of the piezoelectric substrate 10b and the support substrate 10a is a plain surface and flat. Terminals 14a and 14b are located on the lower surface of the substrate 10. The terminals 14a and 14b are foot pads for connecting functional elements 12 and 22 to external devices. The functional element 12 and wiring lines 18a and 18b are located on the upper surface of the substrate 10. Via wirings 16a through 16c penetrating through the substrate 10 are provided. The terminals 14a and 14b, the via wirings 16a through 16c, and the wiring lines 18a and 18b are formed of, for example, a metal layer such as a copper layer, an aluminum layer, or a gold layer. The via wirings 16a and 16b electrically connect the wiring lines 18a and 18b and the terminals 14a and 14b, respectively. A ring-shaped electrode 36 is located in the outer periphery of the upper surface of the substrate 10. The ring-shaped electrode 36 is formed of a metal layer such as a nickel layer, a copper layer, an aluminum layer, or a gold layer.

The functional element 22 and wiring lines 28a and 28b are located on the lower surface of the substrate 20. The substrate 20 is, for example, an insulating substrate such as a glass substrate, or a semiconductor substrate such as a silicon substrate. The wiring lines 28a and 28b are formed of, for example, a metal layer such as a copper layer, an aluminum layer, or a gold layer. The substrate 20 is flip-chip mounted (face-down mounted) on the substrate 10 thorough bumps 38a and 38b. The bumps 38a and 38b are, for example, gold bumps, solder bumps, or copper bumps. The bump 38a bonds the wiring lines 28a and 18a, while the bump 38b bonds the wiring line 28b and the wiring line 18b.

A sealing member 30 is located on the substrate 10 so as to surround the substrate 20. The sealing member 30 is made of, for example, a metallic material such as solder. The sealing member 30 is bonded to the ring-shaped electrode 36. The sealing member 30 is not bonded on the side surface of the substrate 20. A flat plate-like lid 32 is located on the upper surface of the substrate 20 and the upper surface of the sealing member 30. The lid 32 is, for example, a metal plate or an insulating plate. A protective film 34 is provided so as to cover the lid 32 and the sealing member 30. The protective film 34 is a metal film or an insulating film.

The functional elements 12 and 22 face each other across an air gap 25. The air gap 25 is sealed by the sealing member 30, the substrate 10, the substrate 20, and the lid 32. The bumps 38a and 38b are surrounded by the air gap 25.

The terminal 14a is electrically connected to the functional element 12 through the via wiring 16a and the wiring line 18a. The terminal 14a is also electrically connected to the functional element 22 through the via wiring 16a, the wiring line 18a, the bump 38a, and the wiring line 28a. The terminal 14b is electrically connected to the functional element 12 through the via wiring 16b and the wiring line 18b, and is also electrically connected to the functional element 22 through the via wiring 16b, the wiring line 18b, the bump 38b, and the wiring line 28b. Furthermore, the terminal 14b is electrically connected to the sealing member 30 through the via wiring 16c. When a ground potential is supplied to the terminal 14b, the sealing member 30 is grounded.

Figure 2A:
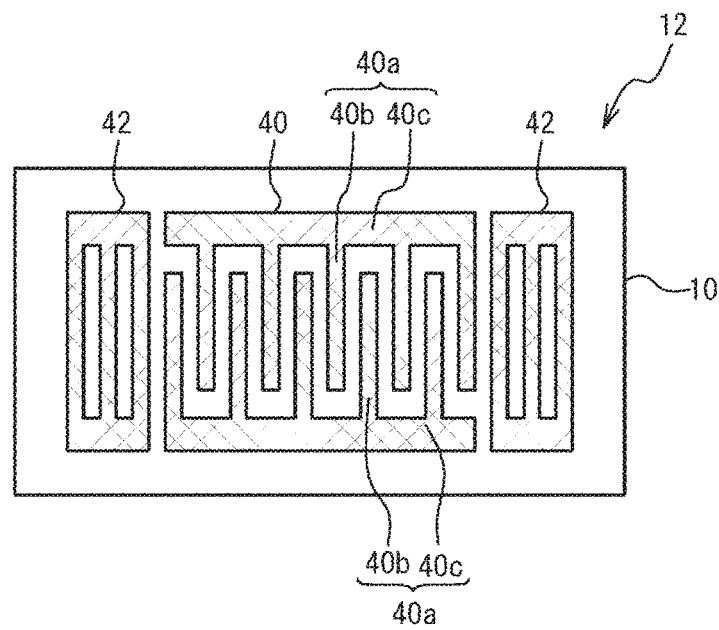
FIG. 2A is a plan view of a functional element 12.
Figure 2B:
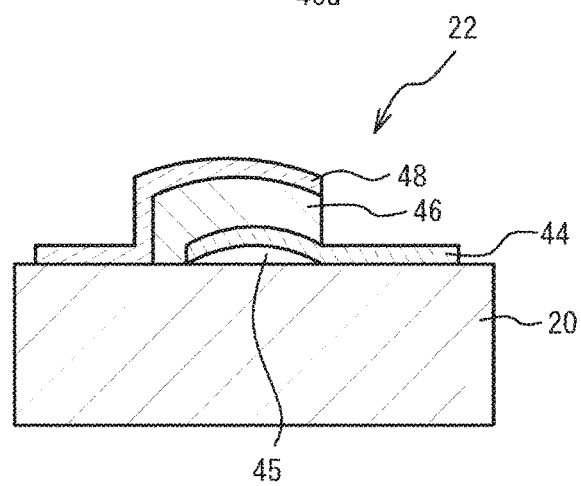
FIG. 2B is a cross-sectional view of a functional element 22.

FIG. 2A is a plan view of the functional element 12, and FIG. 2B is a cross-sectional view of the functional element 22. As illustrated in FIG. 2A, the functional element 12 is a surface acoustic wave resonator. An Interdigital Transducer (IDT) 40 and reflectors 42 are formed on the substrate 10. The IDT 40 includes a pair of comb-shaped electrodes 40a facing each other. The comb-shaped electrode 40a includes a plurality of electrode fingers 40b and a bus bar 40c to which the electrode fingers 40b are connected. The reflectors 42 are located at the both sides of the IDT 40. The IDT 40 excites a surface acoustic wave on the piezoelectric substrate 10b. The piezoelectric substrate 10b is, for example, a lithium tantalate substrate or a lithium niobate substrate. The IDT 40 and the reflectors 42 are formed of, for example, an aluminum film or a copper film.

As illustrated in FIG. 2B, the functional element 22 is a piezoelectric thin film resonator. A piezoelectric film 46 is located on the substrate 20. A lower electrode 44 and an upper electrode 48 are provided so as to sandwich the piezoelectric film 46. An air gap 45 is formed between the lower electrode 44 and the substrate 20. The lower electrode 44 and the upper electrode 48 excite the acoustic wave in the thickness extension mode in the piezoelectric film 46. As described above, the functional elements 12 and 22 excite acoustic waves. The lower electrode 44 and the upper electrode 48 are formed of, for example, a metal film such as a ruthenium film. The piezoelectric film 46 is, for example, an aluminum nitride film. The substrate 20 is an insulating substrate or a semiconductor substrate.

The functional elements 12 and 22 include electrodes that excite acoustic waves. Thus, the functional elements 12 and 22 are covered with the air gap 25 so as not to restrain the acoustic waves.

Hereinafter, exemplary materials and dimensions of the first embodiment will be described. The support substrate 10a is a sapphire substrate with a film thickness of 100 μm. The piezoelectric substrate 10b is a lithium tantalate substrate with a film thickness of 20 μm. When the linear thermal expansion coefficient of the support substrate 10a is less than that of the piezoelectric substrate 10b, the frequency-temperature dependence of the acoustic wave element of the functional element 12 is small. The terminals 14a and 14b are formed of a copper layer with a film thickness of 2 μm, a nickel layer with a film thickness of 5 μm, and a gold layer with a film thickness of 0.5 μm stacked in this order from the support substrate 10a side. The via wiring is a copper via wiring. The ring-shaped electrode 36 is formed of a nickel layer with a film thickness of 5 μm. The bumps 38a and 38b are gold bumps. The substrate 20 is a silicon substrate. The sealing member 30 is made of SnAg solder. The lid 32 is made of a kovar plate with a film thickness of 15 μm. The protective film 34 is formed of a nickel layer with a film thickness of 10 μm.

Figure 3:
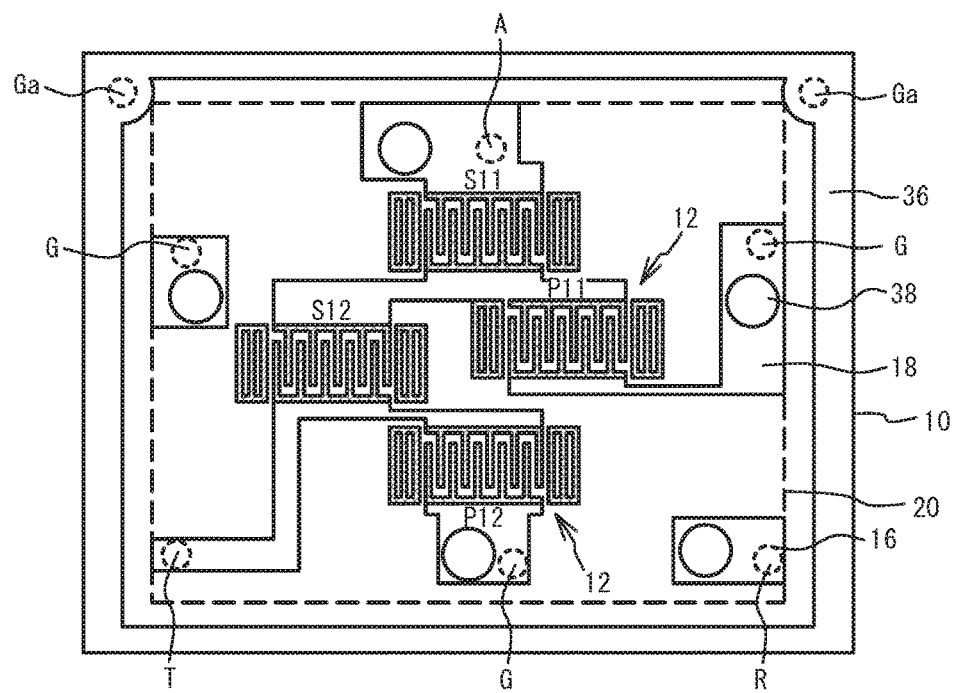
FIG. 3 is a plan view of a substrate 10 in the first embodiment.

FIG. 3 is a plan view of the substrate 10 in the first embodiment. As illustrated in FIG. 3, a plurality of the functional elements 12, wiring lines 18, and the ring-shaped electrode 36 are located on the substrate 10. The functional elements 12 include series resonators S11 and S12 and parallel resonators P11 and P12. Bumps 38 are located on the wiring lines 18. Via wirings 16 connecting to the wiring lines 18 are formed in the substrate 10. The dashed line indicates a region in which the substrate 20 is to be mounted. The reference characters "A", "T", "R", and "G" respectively represent the via wirings 16 coupled to a common terminal, a transmit terminal, a receive terminal, and a ground terminal. The reference character "Ga" represents the via wiring 16 coupled to the ground terminal. The series resonators S11 and S12 are connected in series between a common terminal A and a transmit terminal T through the wiring lines 18. The parallel resonators P11 and P12 are connected in parallel between the common terminal A and the transmit terminal T through the wiring lines 18. The parallel resonators P11 and P12 are coupled to ground terminals G through the wiring lines 18. As described above, a ladder-type filter as a transmit filter is located on the substrate 10.

Figure 4:
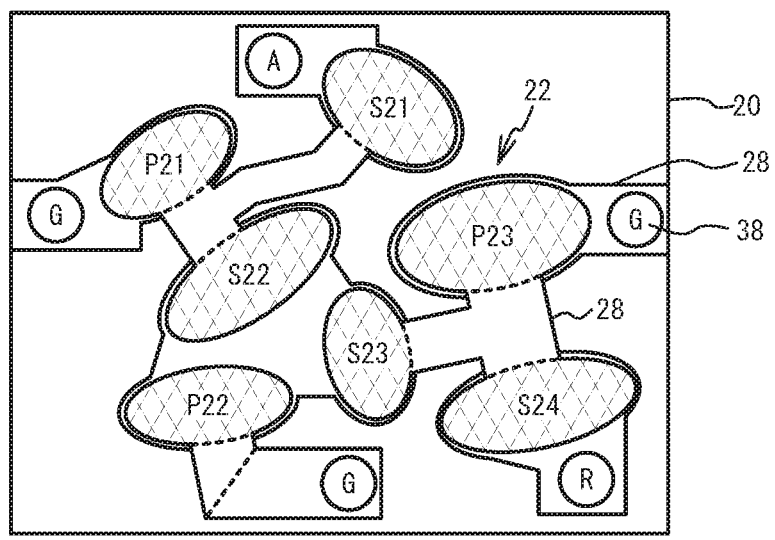
FIG. 4 is a plan view of a substrate 20 in the first embodiment.

FIG. 4 is a plan view of a substrate 20 in the first embodiment. To make the correspondence between FIG. 4 and FIG. 3 easier to understand, FIG. 4 transparently presents the plan view from above the substrate 20. As illustrated in FIG. 4, on the substrate 20 (In FIG. 2B, the lower surface), located are a plurality of the functional elements 22, wiring lines 28, and the bumps 38. The reference characters "A", "R", and "G" respectively represent the bumps 38 coupled to the common terminal, the receive terminal, and the ground terminal. Series resonators S21 through S24 are connected in series between the common terminal A and a receive terminal R through the wiring lines 28. Parallel resonators P21 through P23 are connected in parallel between the common terminal A and the receive terminal R through the wiring lines 28. The parallel resonators P21 through P23 are coupled to the ground terminals G through the wiring lines 28. As described above, a ladder-type filter as a receive filter is located on the substrate 20.

Figure 5:
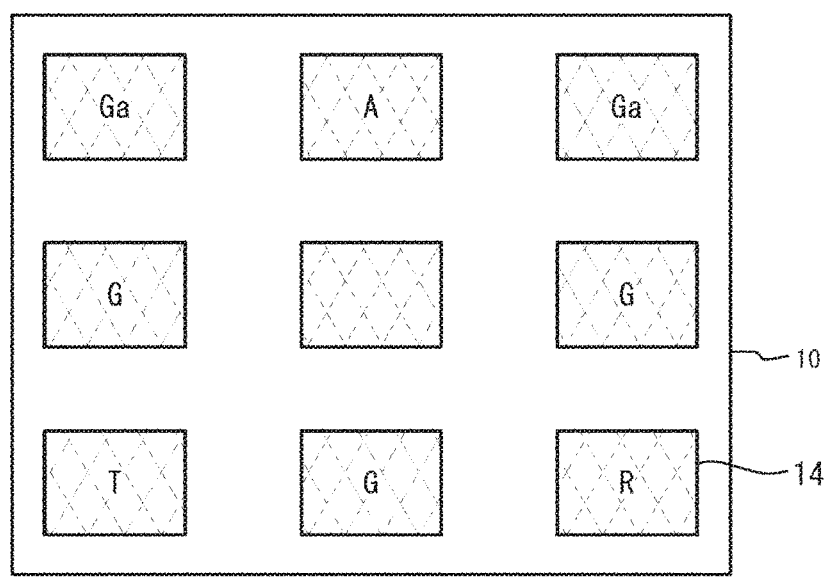
FIG. 5 is a plan view of the lower surface of the substrate 10 in the first embodiment.

FIG. 5 is a plan view of the lower surface of the substrate 10 in the first embodiment. To make the correspondence between FIG. 5 and FIG. 3 easier to understand, FIG. 5 transparently illustrates the plan view from above the substrate 10. Terminals 14 are located on the lower surface of the substrate 10. The reference characters "A", "T", "R", and "G" respectively represent the terminals 14 coupled to the common terminal, the transmit terminal, the receive terminal, and the ground terminal. The common terminal A is electrically connected to the wiring line 18 through the via wiring 16, and is also electrically connected to the wiring line 28 through the bump 38. The transmit terminal T is electrically connected to the wiring line 18 through the via wiring 16. The receive terminal R is electrically connected to the wiring line 28 through the via wiring 16 and the bump 38. The ground terminal G is electrically connected to the wiring line 18 through the via wiring 16, and is also electrically connected to the wiring line 28 through the bump 38. Some ground terminals Ga are electrically connected to the ring-shaped electrode 36 through the via wirings 16.

As described above, the electronic device of the first embodiment functions as a duplexer including: a transmit filter connected between the common terminal A and the transmit terminal T; and a receive filter connected between the common terminal A and the receive terminal R. The transmit filter transmits signals in the transmit band to the common terminal A among high-frequency signals input from the transmit terminal T, and suppresses other signals. The receive filter transmits signals in the receive band to the receive terminal R among high-frequency signals input from the common terminal A, and suppresses other signals. The first embodiment has described a duplexer as an example, but the filter located on the substrate 10 and the filter located on the substrate 20 may not be necessarily connected. An exemplary case where the receive filter and the transmit filter are ladder-type filters, but one of the receive filter or the transmit filter may be a multimode type filter.

Figure 6:
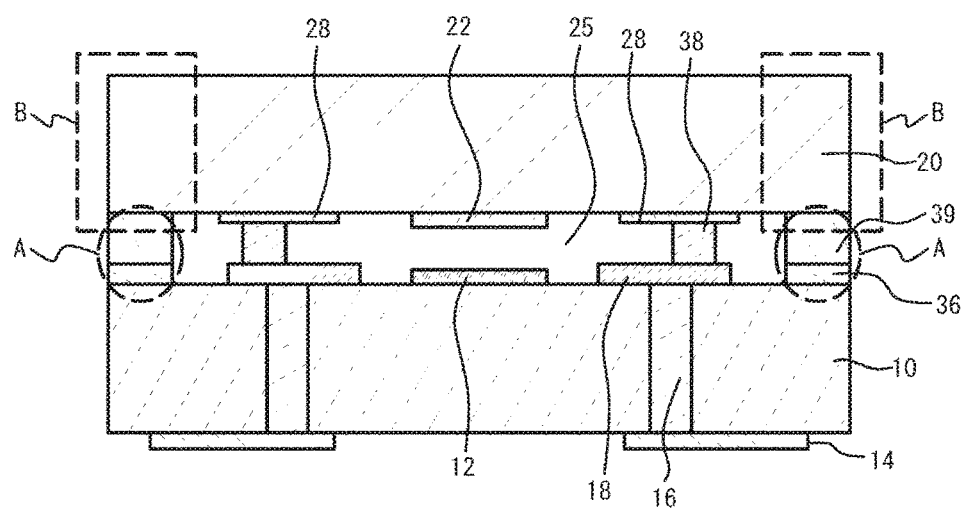
FIG. 6 is a cross-sectional view of an electronic device in accordance with a first comparative example.

FIG. 6 is a cross-sectional view of an electronic device in accordance with a first comparative example. As illustrated in FIG. 6, the functional element 12 is located on the upper surface of the substrate 10, while the functional element 22 is located on the lower surface of the substrate 20. The substrate 10 and the substrate 20 are bonded together with use of the ring-shaped electrode 36 and an interlayer 39. Other structures are the same as those of the first embodiment, and the description is thus omitted.

In the first comparative example, the substrate 10 and the substrate 20 face each other across the interlayer 39, and are bonded together by the interlayer 39 (a region A). Therefore, a stress is easily applied between the substrates 10 and 20. For example, when the linear thermal expansion coefficients differ between the substrates 10 and 20, the thermal stresses of the substrates 10 and 20 are applied, straining the substrate 10. The strain of the substrate 10 causes the deterioration of the characteristics of the functional element 12. In contrast, in the first embodiment, as illustrated in FIG. 1, the substrates 10 and 20 are bonded only to the bumps 38 in a region where the substrate 10 and the substrate 20 face each other. This structure causes the stress to be less applied between the substrates 10 and 20. Therefore, the strain of the substrates 10 and 20 is reduced. In the first embodiment, the substrate 20 does not have a region corresponding to a region B in FIG. 6 of the first comparative example. Thus, the substrate 20 can be reduced in size. Furthermore, in the first comparative example, the substrate 10 and the substrate 20 are bonded together in a wafer state. In contrast, the first embodiment can mount the substrate 20 in a chip state on the substrate 10. Therefore, the first embodiment makes it possible to mount only good substrates 20 on the substrate 10. Accordingly, the yield ratio of the electronic device can be increased.

In the first embodiment, the substrate 20 (a second substrate) is flip-chip mounted on the upper surface of the substrate 10 (a first substrate) through the bumps 38. The sealing member 30 is located on the upper surface of the substrate 10 so as to surround the substrate 20 in plan view, and is not located between the substrates 10 and 20. The sealing member 30 seals the functional element 12 (a first functional element) and the functional element 22 (a second functional element) so that the functional element 12 and the functional element 22 are located across the air gap 25. As described above, no sealing member 30 is located between the substrates 10 and 20, and the substrates 10 and 20 are bonded together by the bumps 38. This structure can reduce especially the stress applied to the substrate 10, and thereby reduce the deterioration of the characteristics of the functional element 12.

The sealing member 30 is preferably bonded to the upper surface of the substrate 10, and is preferably not bonded to the side surface of the substrate 20. This structure can inhibit the stress of the substrate 20 from being applied to the sealing member 30. Therefore, the stress of the substrate 20 can be inhibited from being applied to the substrate 10 through the sealing member 30.

The lid 32 is located on the upper surface of the substrate 20 and the upper surface of the sealing member 30. The lid 32 is preferably not bonded to the upper surface of the substrate 20, and is preferably bonded to the upper surface of the sealing member 30. This structure inhibits the stress of the substrate 20 from being applied to the substrate 10 through the lid 32.

The substrates 10 and 20 have different linear thermal expansion coefficients. Thus, the thermal stress is easily applied between the substrates 10 and 20. The provision of the sealing member 30 can reduce the thermal stress between the substrates 10 and 20.

When the functional element 12 includes an acoustic wave element such as an acoustic wave resonator, if the substrate 10 strains, the characteristics of the functional element 12 easily deteriorate. The provision of the sealing member 30 can reduce the deterioration of the characteristics of the functional element 12.

When the functional element 22 includes an acoustic wave element, if the substrate 20 strains, the characteristics of the functional element 22 easily deteriorate. The provision of the sealing member 30 can reduce the deterioration of the characteristics of the functional element 22.

The terminal 14 is located on the lower surface of the substrate 10, and a wiring line such as the via wiring 16 connects the terminal 14 and the functional element 12. This structure allows the functional element 12 and the terminal 14 to be electrically connected.

When the sealing member 30 is made of a metallic material, the functional elements 12 and 22 can be shielded. When the sealing member 30 is made of solder, the sealing member 30 can be easily formed.

The functional element 12 may include a receive filter, and the functional element 22 may include a transmit filter. However, the functional element 12 preferably includes a transmit filter, and the functional element 22 preferably includes a receive filter. The heat generated in the functional elements 12 and 22 are mainly released from the lower surface of the substrate 10. Thus, by forming a transmit filter, which releases more heat, on the substrate 10, the heat release through the substrate 10 becomes possible.

The support substrate 10a is preferably a sapphire substrate, and the piezoelectric substrate 10b is preferably a lithium tantalate substrate or a lithium niobate substrate. The sapphire substrate has good thermal conductivity, excelling in heat release performance. Accordingly, efficient heat release through the sapphire substrate becomes possible. Furthermore, since the sapphire substrate is easy to process, the via wirings 16 can be easily formed.

Figure 7:
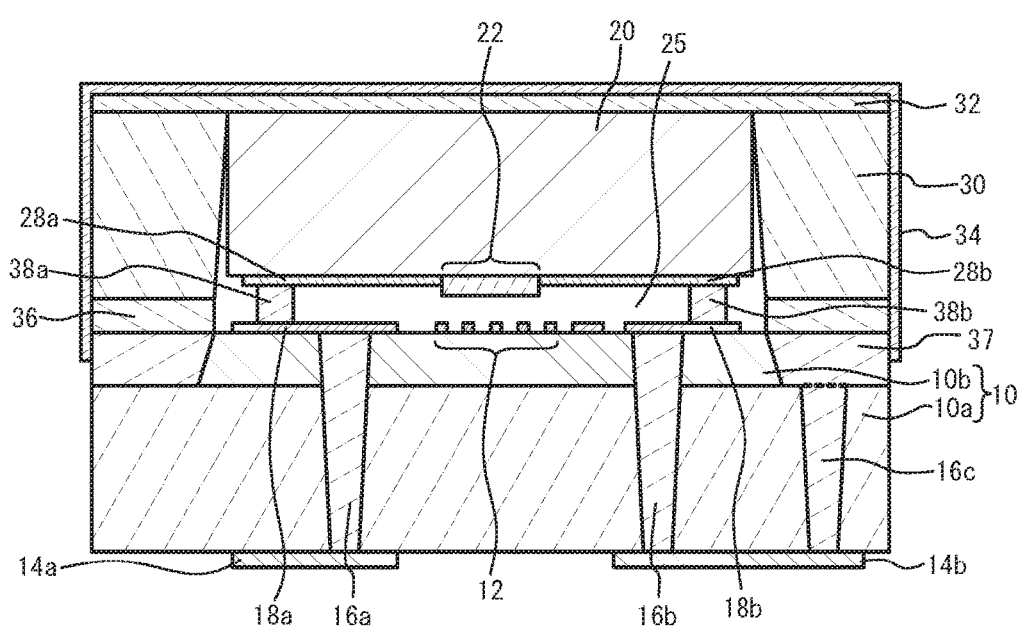
FIG. 7 is a cross-sectional view of an electronic device in accordance with a first variation of the first embodiment.

FIG. 7 is a cross-sectional view of an electronic device in accordance with a first variation of the first embodiment. As illustrated in FIG. 7, the piezoelectric substrate 10b under the ring-shaped electrode 36 is removed, and a ring-shaped metal layer 37 is located between the support substrate 10a and the ring-shaped electrode 36. The film thickness of the ring-shaped metal layer 37 is identical to, for example, that of the piezoelectric substrate 10b, and approximately 20 µm. The ring-shaped metal layer 37 is, for example, a copper layer. Other structures are the same as those of the first embodiment, and the description thereof is thus omitted.

The piezoelectric substrate 10b has a thermal conductivity less than that of the support substrate 10a. Thus, in the first embodiment, thermal conductance between the support substrate 10a and the sealing member 30 is low. In addition, since the piezoelectric substrate 10b is weak, the piezoelectric substrate 10b may be damaged by the stress from the sealing member 30. In the first variation of the first embodiment, the support substrate 10a and the sealing member 30 are bonded together through the ring-shaped metal layer 37. The ring-shaped metal layer 37 has a thermal conductivity higher than that of the piezoelectric substrate 10b. Accordingly, the heat conductance between the support substrate 10a and the sealing member 30 can be made to be more efficient. In addition, since the piezoelectric substrate 10b under the sealing member 30 is removed, the damage to the piezoelectric substrate 10b can be inhibited.

Figure 8A:
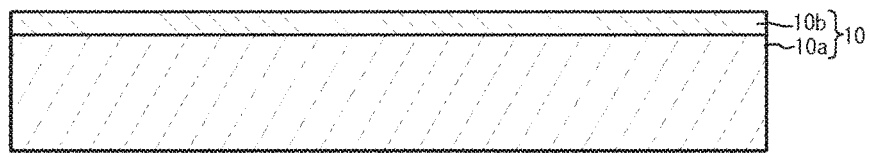
FIG. 8A through FIG. 8D are cross-sectional views (No. 1) illustrating a method of fabricating the electronic device of the first variation of the first embodiment.

FIG. 8A through FIG. 10C are cross-sectional views illustrating a method of fabricating the electronic device in accordance with the first variation of the first embodiment. As illustrated in FIG. 8A, the lower surface of the piezoelectric substrate 10b is bonded to the upper surface of the support substrate 10a. This bonding is performed in a wafer state. Examples of a bonding method include, but are not limited to, a method that activates the upper surface of the support substrate 10a and the lower surface of the piezoelectric substrate 10b and then bonds them at room temperature, or a method that bonds them with an adhesive agent.

Figure 8B:
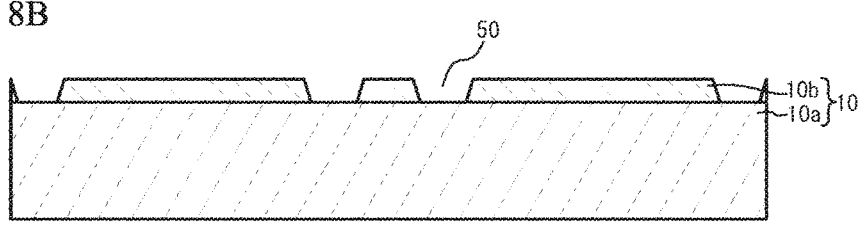

As illustrated in FIG. 8B, desired apertures 50 are formed in the piezoelectric substrate 10b. The apertures 50 are formed by, for example, blasting using a patterned photoresist as a mask. The apertures 50 may be formed by ion milling or wet etching instead of blasting.

Figure 8C:
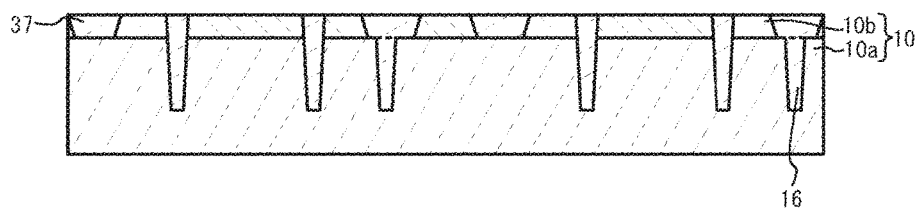

As illustrated in FIG. 8C, via holes are formed in the piezoelectric substrate 10b and the support substrate 10a. The via holes are formed by, for example, irradiating the piezoelectric substrate 10b and the support substrate 10a with a laser beam. A seed layer (not illustrated) is formed in the via holes and in the apertures 50. A current is supplied to the seed layer to form the via wirings 16 in the via holes and the ring-shaped metal layer 37 in the apertures 50 by electrolytic plating. When the via wirings 16 and the ring-shaped metal layer 37 are made of a copper layer, the seed layer may be, for example, a titanium film with a film thickness of 100 µm and a copper layer with a film thickness of 200 µm stacked in this order from the substrate 10 side. Unnecessary plated layers are removed by Chemical Mechanical Polishing (CMP) or the like.

Figure 8D:
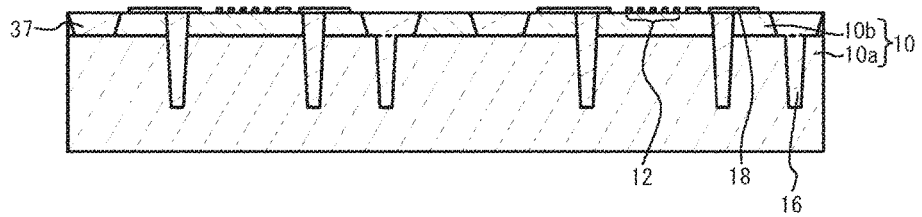

As illustrated in FIG. 8D, the functional elements 12 and the wiring lines 18 are formed on the upper surface of the piezoelectric substrate 10b. The functional elements 12 are formed of, for example, a titanium film and an aluminum film staked in this order from the substrate 10 side. The wiring lines 18 are formed of, for example, a titanium film and a gold film stacked in this order from the substrate 10 side.

Figure 9A:
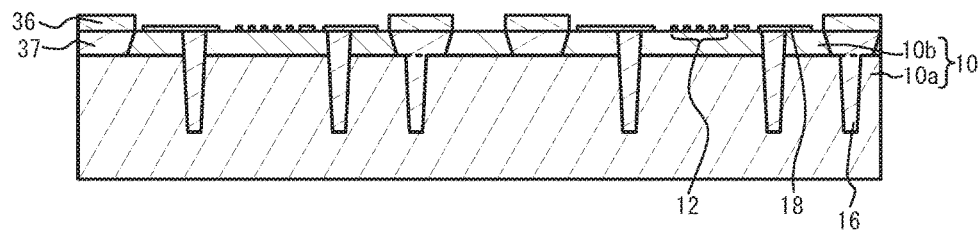
FIG. 9A through FIG. 9D are cross-sectional views (No. 2) illustrating the method of fabricating the electronic device of the first variation of the first embodiment.
Figure 9B:
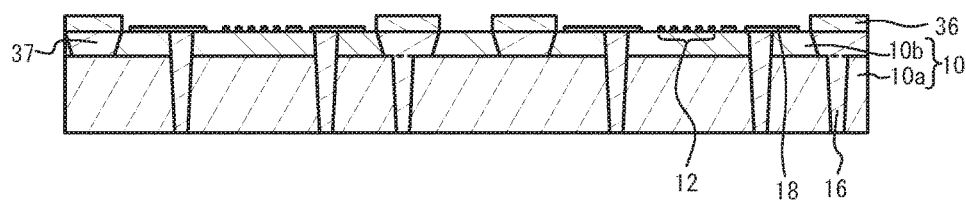

As illustrated in FIG. 9A, the ring-shaped electrodes 36 are formed on the ring-shaped metal layer 37. The ring-shaped electrodes 36 are formed of, for example, a titanium film and a nickel film stacked in this order from the substrate 10 side, and are formed by evaporation and liftoff. As illustrated in FIG. 9B, the lower surface of the substrate 10 is polished or ground. This process exposes the via wirings 16 from the lower surface of the substrate 10.

Figure 9C:
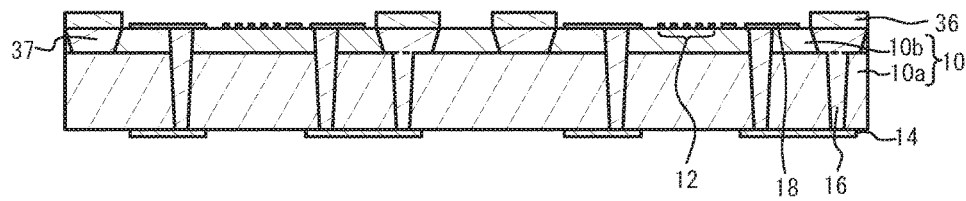

As illustrated in FIG. 9C, the terminals 14 are formed so as to make contact with the via wirings 16. For example, a seed layer is formed on the lower surface of the substrate 10. A photoresist having apertures is formed under the seed layer. A current is supplied to the seed layer to form a plated layer in the apertures by electrolytic plating. The seed layer other than the plated layer is then removed. The seed layer is formed of, for example, a titanium film and a copper film stacked in this order from the substrate 10 side. The plated layer is formed of, for example, a copper layer, a nickel layer, and a gold layer stacked in this order from the substrate 10 side.

Figure 9D:
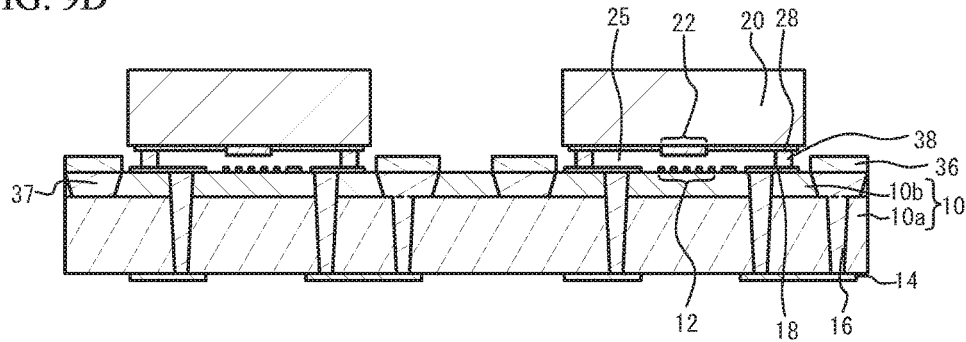

As illustrated in FIG. 9D, the substrates 20 are flip-chip mounted on the substrate 10. The substrate 20 is a chip after cutting the substrate 20 into individual chips, and gold stud bumps as the bumps 38 are formed on the lower surface of the substrate 20.

Figure 10A:
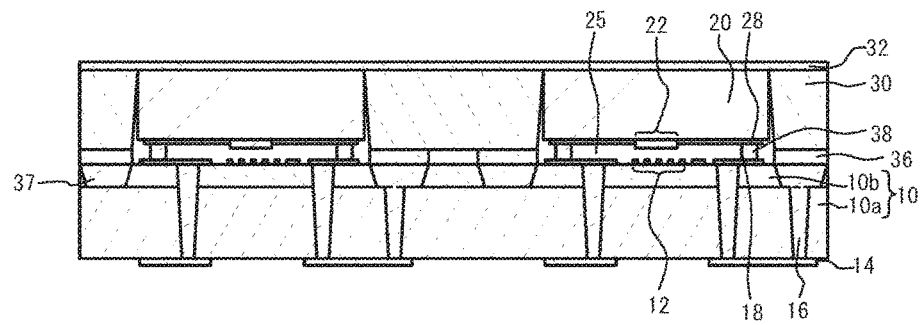
FIG. 10A through FIG. 10C are cross-sectional views (No. 3) illustrating the method of fabricating the electronic device of the first variation of the first embodiment.

As illustrated in FIG. 10A, a solder plate is formed on the substrate 10 so as to cover the substrate 20. The lid 32 is placed onto the solder plate. The solder plate is pressed to the substrate 10 by the lid 32, and the lid 32 is then heated to a temperature greater than the melting point of the solder plate. This process melts the solder plate, and thereby forms the sealing member 30. Since the upper surface of the ring-shaped electrode 36 has a good solderability, the sealing member 30 is bonded to the substrate 10 through the ring-shaped electrode 36. Since the surface of the substrate 20 has a bad solderability, the sealing member 30 is not bonded to the side surface of the substrate 20 even when making contact with the side surface of the substrate 20. The lid 32 has a good solderability, and the sealing member 30 is thus bonded to the lid 32. The lid 32 makes contact with the upper surface of the substrate 20, but is not bonded to the upper surface of the substrate 20.

Figure 10B:
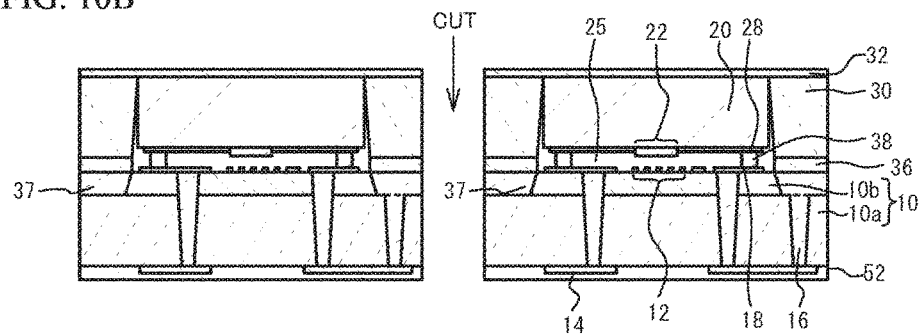
Figure 10C:
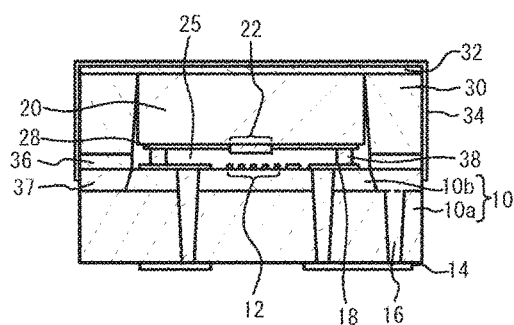

As illustrated in FIG. 10B, the lower surface of the substrate 10 is protected by a protective layer 52 such as a photoresist. The lid 32, the sealing member 30, and the substrate 10 are cut by dicing. As illustrated in FIG. 10C, the protective film 34 is formed so as to cover the side surface of the sealing member 30. The protective film 34 is formed by, for example, barrel plating. The above-described processes complete the electronic device in accordance with the first variation of the first embodiment.

Figure 11:
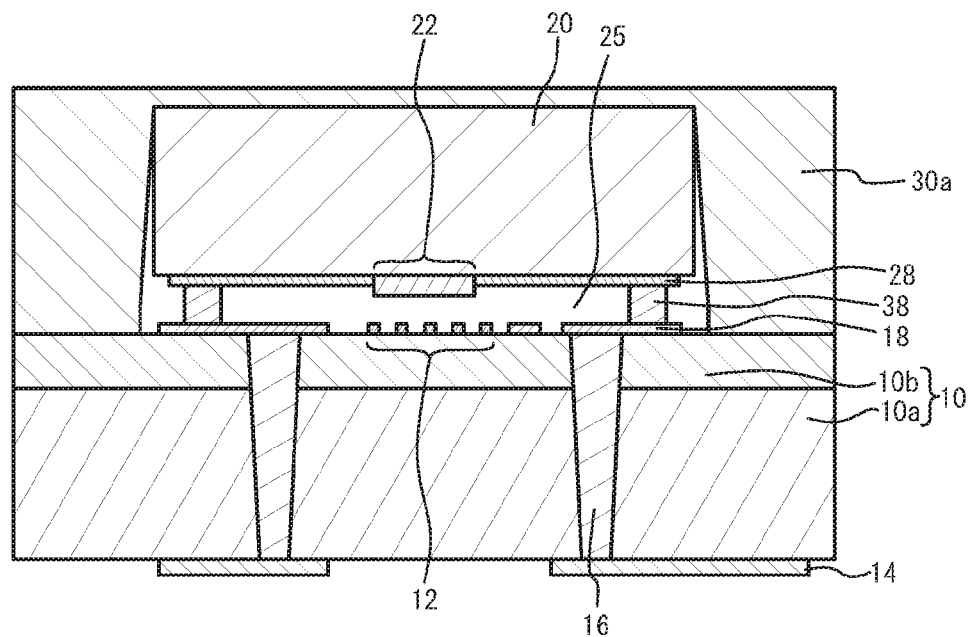
FIG. 11 is a cross-sectional view of an electronic device in accordance with a second variation of the first embodiment.

FIG. 11 is a cross-sectional view of an electronic device in accordance with a second variation of the first embodiment. As illustrated in FIG. 11, a resin material is used as a sealing member 30a. A ring-shaped electrode is not provided. A via wiring connecting to the sealing member 30a is not formed. Other structures are the same as those of the first embodiment, and the description thereof is thus omitted. As in the second variation of the first embodiment, the sealing member may be made of an insulating material.

Figure 12:
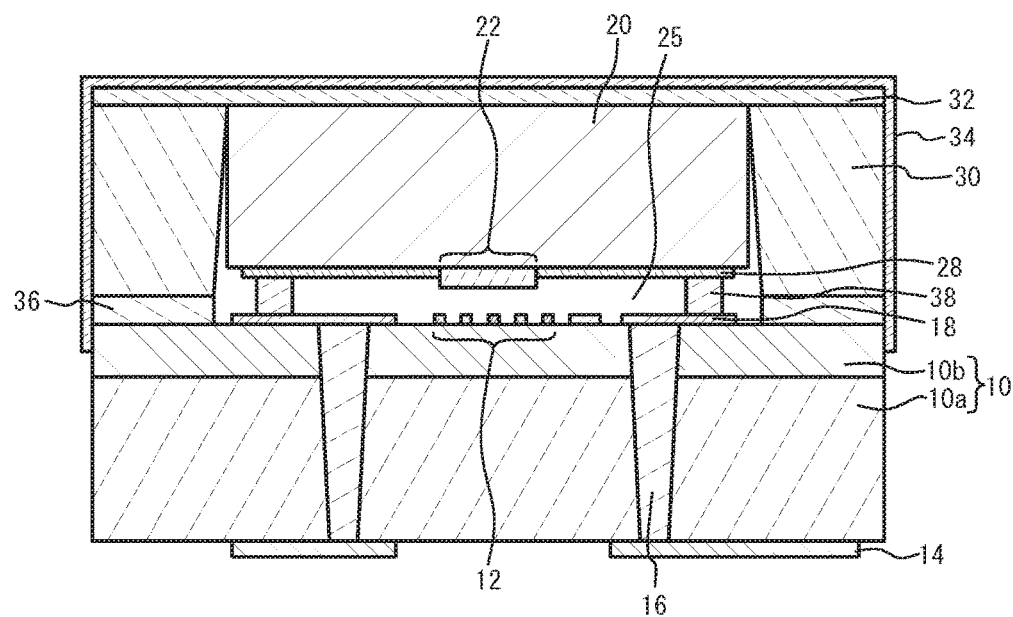
FIG. 12 is a cross-sectional view of an electronic device in accordance with a third variation of the first embodiment.

FIG. 12 is a cross-sectional view of an electronic device in accordance with a third variation of the first embodiment. As illustrated in FIG. 12, no ring-shaped electrode is provided. No via wiring connecting to the sealing member 30 is formed. Other structures are the same as those of the first embodiment, and the description thereof is thus omitted. As in the third variation of the first embodiment, even when the sealing member 30 is made of a metallic material, the sealing member 30 may not be necessarily coupled to the terminal 14.

Second Embodiment

Figure 13:
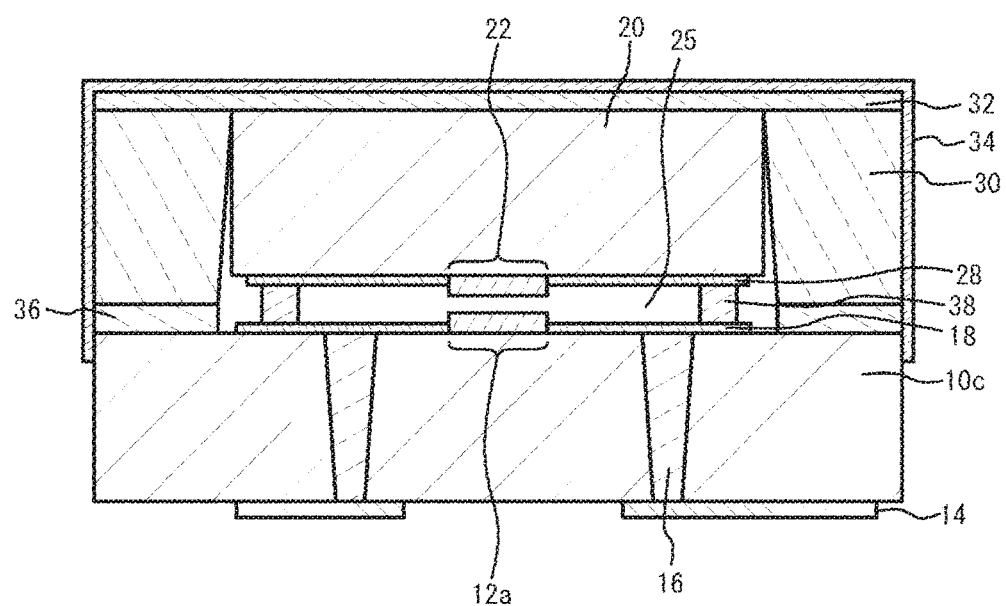
FIG. 13 is a cross-sectional view of an electronic device in accordance with a second embodiment.

FIG. 13 is a cross-sectional view of an electronic device in accordance with a second embodiment. As illustrated in FIG. 13, a functional element 12a is formed on the upper surface of a substrate 10c. The functional element 12a is a piezoelectric thin film resonator illustrated in FIG. 2B. Other structures are the same as those of the third variation of the first embodiment, and the description thereof is thus omitted. As in the second embodiment, the substrate 20 including a piezoelectric thin film resonator formed thereon may be flip-chip mounted on the substrate 10c including a piezoelectric thin film resonator formed thereon.

Figure 14:
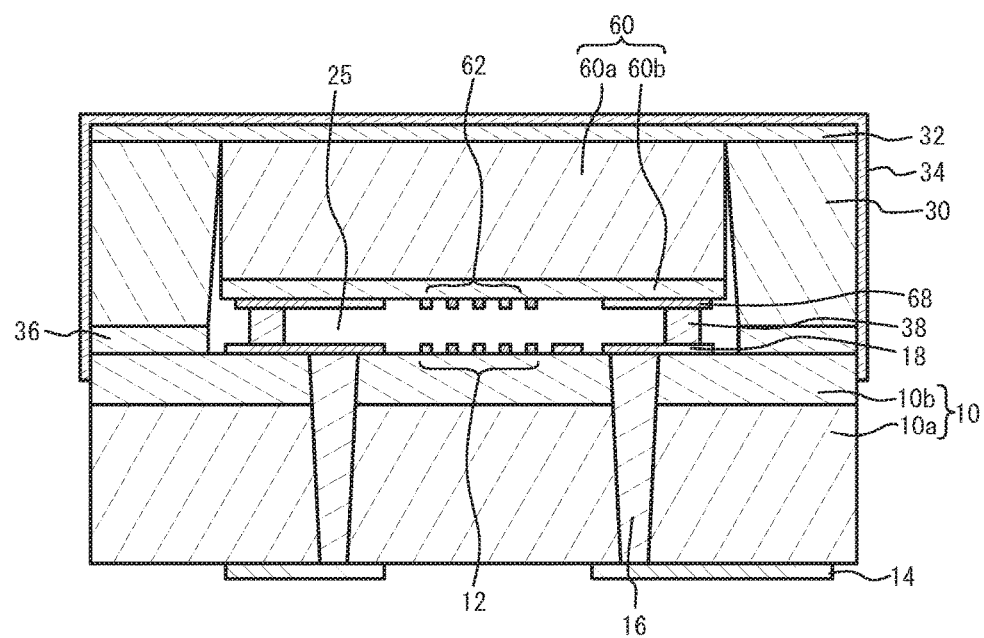
FIG. 14 is a cross-sectional view of an electronic device in accordance with a first variation of the second embodiment.

FIG. 14 is a cross-sectional view of an electronic device in accordance with a first variation of the second embodiment. As illustrated in FIG. 14, a substrate 60 is flip-chip mounted on the substrate 10. In the substrate 60, a piezoelectric substrate 60b is bonded on (under in FIG. 14) a support substrate 60a. A surface acoustic wave resonator as a functional element 62 is formed on the lower surface of the piezoelectric substrate 60b. Other structures are the same as those of the third variation of the first embodiment, and the description thereof is thus omitted. As in the first variation of the second embodiment, the substrate 60 including a surface acoustic wave resonator formed thereon may be flip-chip mounted on the substrate 10 including a surface acoustic wave resonator formed thereon.

Figure 15:
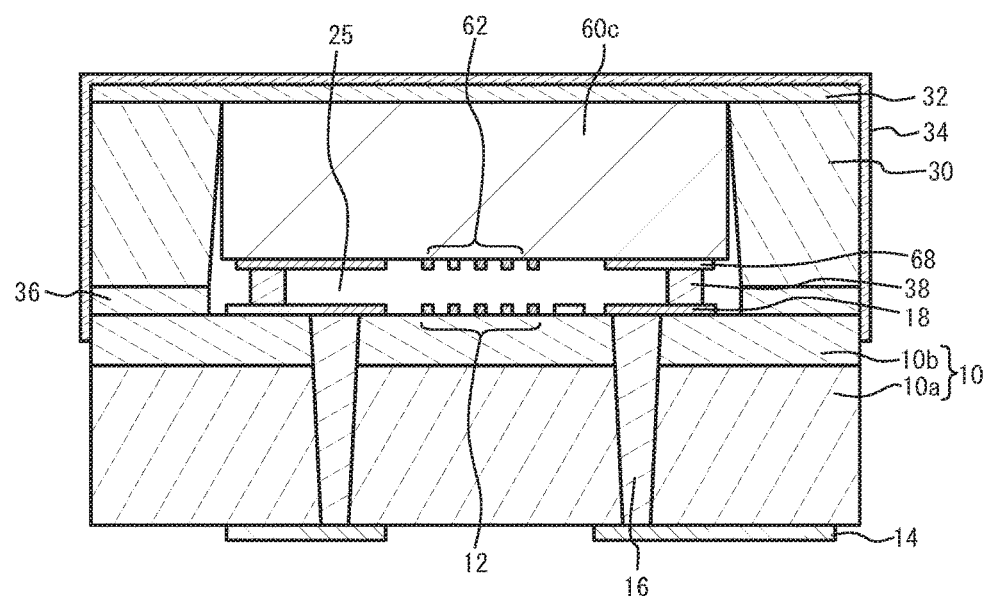
FIG. 15 is a cross-sectional view of an electronic device in accordance with a second variation of the second embodiment.

FIG. 15 is a cross-sectional view of an electronic device in accordance with a second variation of the second embodiment. As illustrated in FIG. 15, a piezoelectric substrate 60c is flip-chip mounted on the substrate 10. The piezoelectric substrate 60c is a piezoelectric substrate. Other structures are the same as those of the first variation of the second embodiment, and the description thereof is thus omitted. As in the second variation of the second embodiment, the substrate to be mounted on the substrate 10 may be the piezoelectric substrate 60c without a support substrate.

Figure 16:
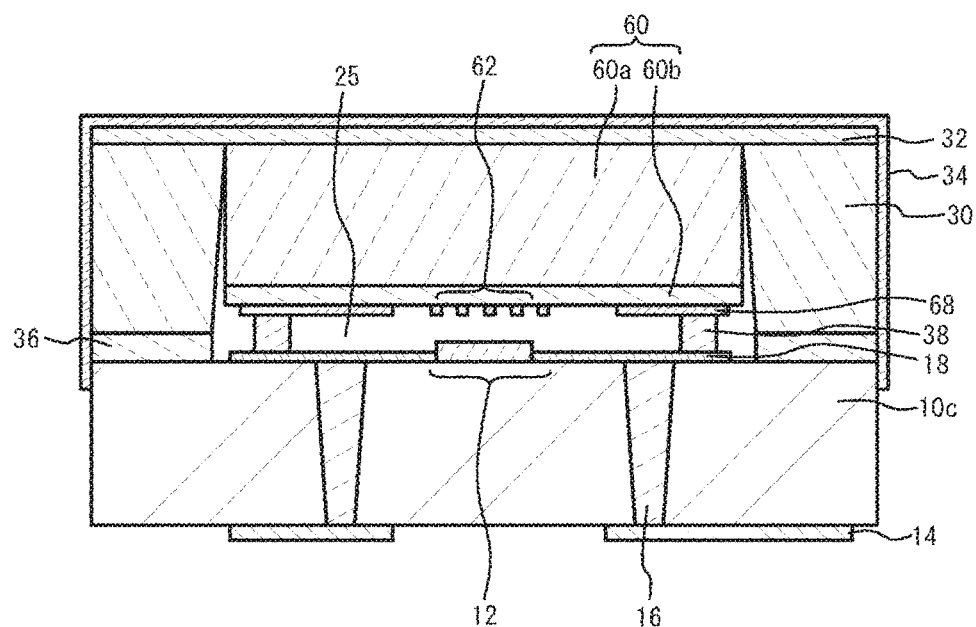
FIG. 16 is a cross-sectional view of an electronic device in accordance with a third variation of the second embodiment.

FIG. 16 is a cross-sectional view of an electronic device in accordance with a third variation of the second embodiment. As illustrated in FIG. 16, the substrate 60 is flip-chip mounted on the substrate 10c. Other structures are the same as those of the second embodiment and the first variation of the second embodiment, and the description thereof is thus omitted. As in the third variation of the second embodiment, the substrate 60 including a surface acoustic wave resonator formed thereon may be flip-chip mounted on the substrate 10c including a piezoelectric thin film resonator formed thereon.

Figure 17:
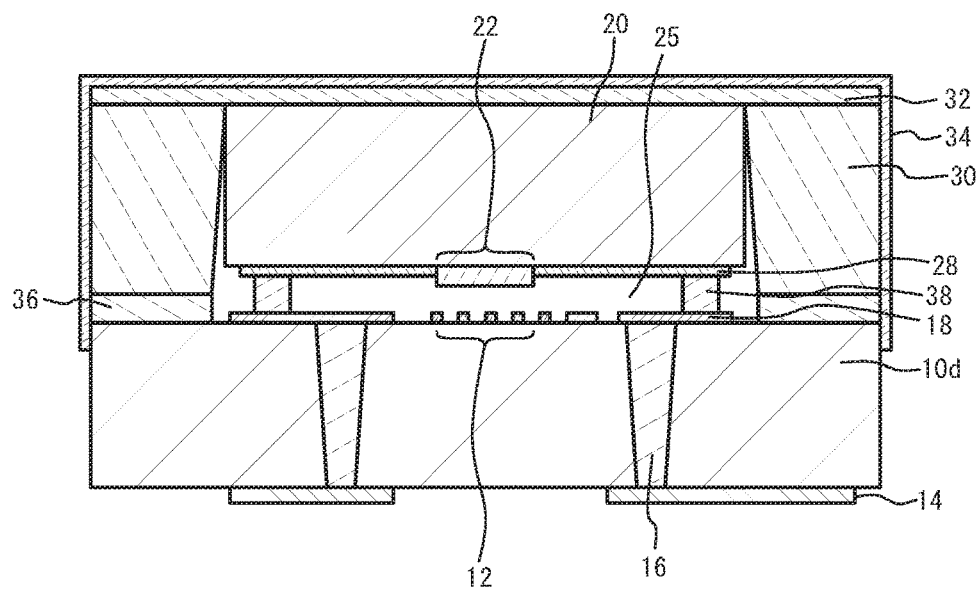
FIG. 17 is a cross-sectional view of an electronic device in accordance with a fourth variation of the second embodiment.

FIG. 17 is a cross-sectional view of an electronic device in accordance with a fourth variation of the second embodiment. As illustrated in FIG. 17, the substrate 20 is flip-chip mounted on a piezoelectric substrate 10d. The piezoelectric substrate 10d is a piezoelectric substrate without a support substrate. Other structures are the same as those of the second embodiment and the third variation of the first embodiment, and the description thereof is thus omitted. As in the fourth variation of the second embodiment, a substrate on which the substrate 20 is to be mounted may be a piezoelectric substrate without a support substrate.

Figure 18A:
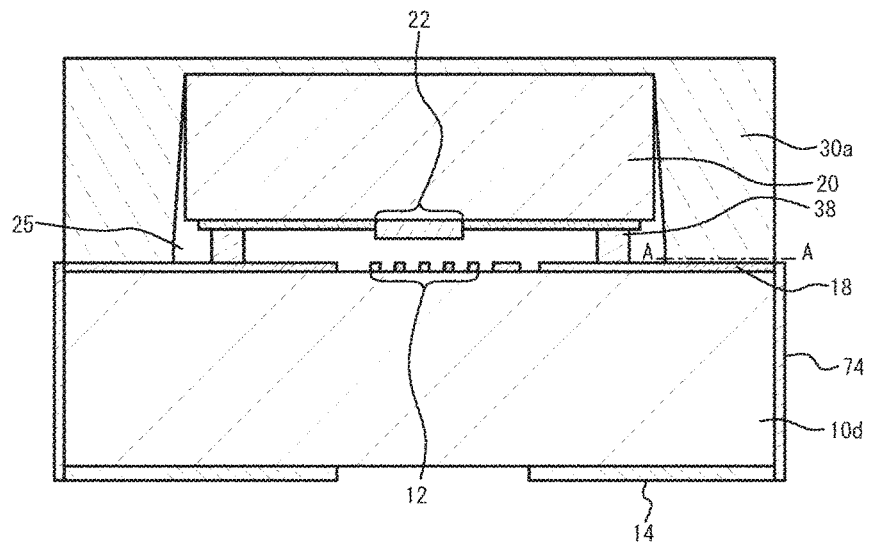
FIG. 18A is a cross-sectional view of an electronic device in accordance with a fifth variation of the second embodiment.
Figure 18B:
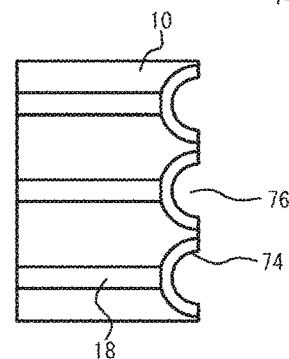
FIG. 18B and FIG. 18C are cross-sectional views taken along line A-A in FIG. 18A.
Figure 18C:
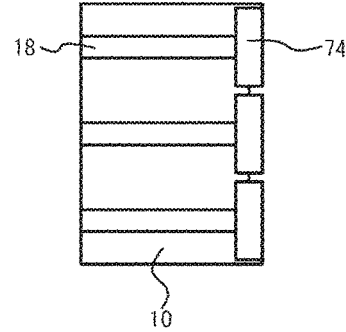

FIG. 18A is a cross-sectional view of an electronic device in accordance with a fifth variation of the second embodiment, and FIG. 18B and FIG. 18C are cross-sectional views taken along line A-A in FIG. 18A. As illustrated in FIG. 18A, the sealing member 30a is a resin member. Wiring lines 74 are located on the side surface of the piezoelectric substrate 10d. The wiring line 74 electrically connects the terminal 14 and the wiring line 18. As illustrated in FIG. 18B, grooves 76 are formed on the side surface, and the wiring lines 74 are formed along the grooves 76. The wiring line 74 is made of a metal layer such as, for example, a copper layer or a gold layer. As illustrated in FIG. 18C, the groove 76 may not be necessarily formed. Other structures are the same as those of the fourth variation of the second embodiment, and the description thereof is thus omitted.

In the fourth variation of the second embodiment, the via wiring 16 is formed in the piezoelectric substrate 10d. When the piezoelectric substrate 10d is a lithium tantalate substrate or a lithium niobate substrate, a via hole penetrating through the piezoelectric substrate 10d is difficult to form. Thus, as in the fifth variation of the second embodiment, the wiring line 74 connecting the terminal 14 and the functional element 12 is preferably located on the side surface of the substrate 10.

As in the second embodiment and the variations thereof, the first functional element may be any one of a surface acoustic wave resonator and a piezoelectric thin film resonator. The second functional element may be any one of a surface acoustic wave resonator and a piezoelectric thin film resonator. In addition, the surface acoustic wave resonator may be a boundary acoustic wave resonator or a Love wave resonator.

Third Embodiment

Figure 19:
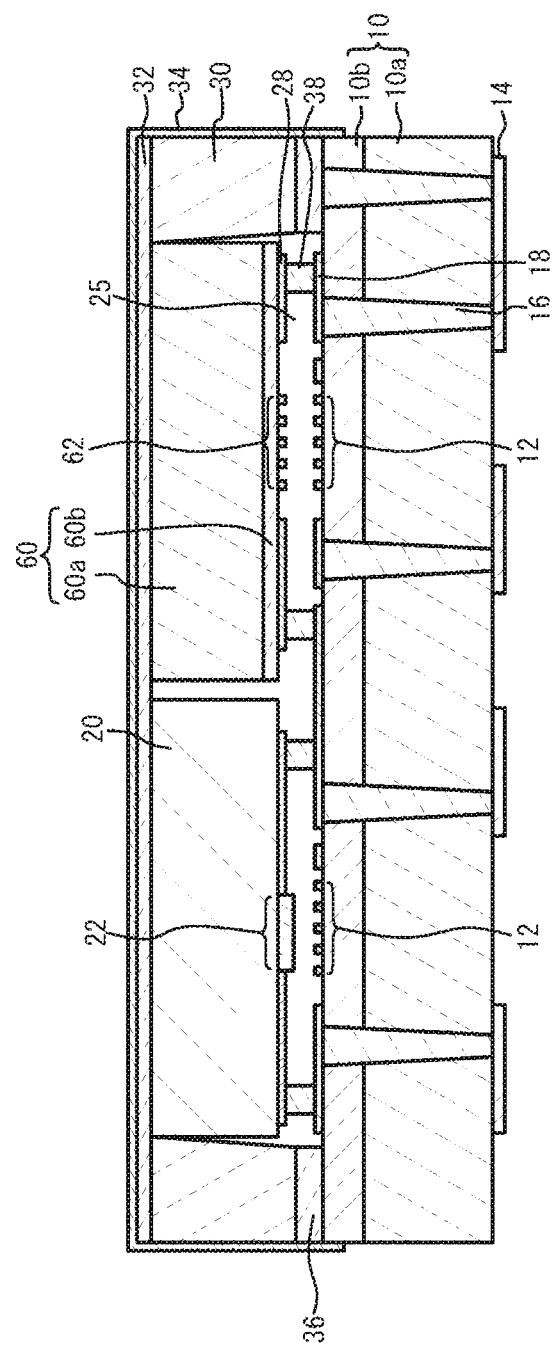
FIG. 19 is a cross-sectional view of an electronic device in accordance with a third embodiment.

FIG. 19 is a cross-sectional view of an electronic device in accordance with a third embodiment. As illustrated in FIG. 19, a plurality of filters as a functional element are formed on the substrate 10. The substrates 20 and 60 are mounted on the substrate 10. A filter as the functional element 22 is formed on the substrate 20. A filter as the functional element 62 is formed on the substrate 60. Other structures are the same as those of the first embodiment, and the description thereof is thus omitted. As in the third embodiment, a plurality of substrates 20 and 60 may be flip-chip mounted on the substrate 10, and the sealing member 30 may be formed so as to surround the substrates 20 and 60. In addition, a plurality of filters may be formed on the substrate 10. This structure enables to make a multiplexer such as a quadplexer.

Fourth Embodiment

Figure 20:
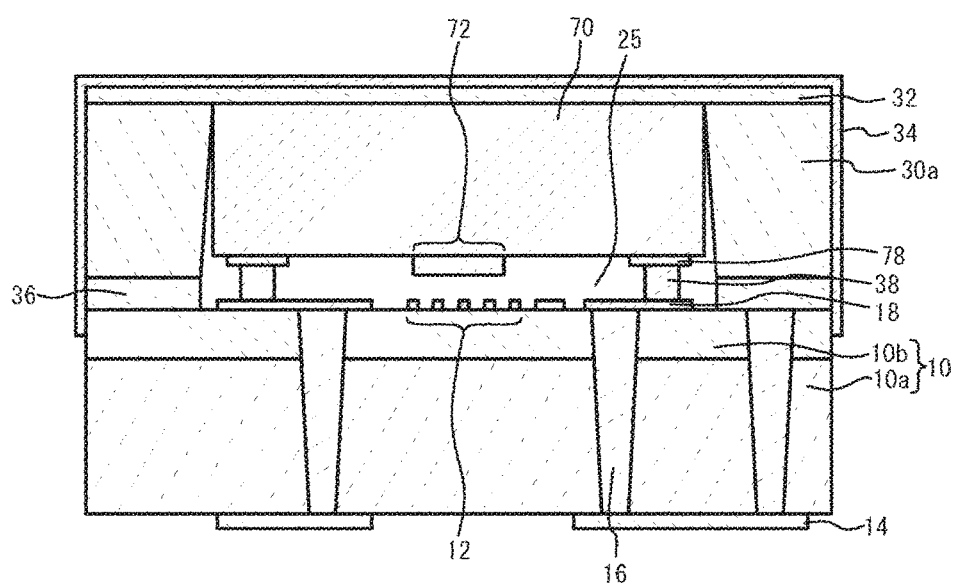
FIG. 20 is a cross-sectional view of an electronic device in accordance with a fourth embodiment.

FIG. 20 is a cross-sectional view of an electronic device in accordance with a fourth embodiment. As illustrated in FIG. 20, a substrate 70 is flip-chip mounted on the substrate 10. A functional element 72 and wiring lines 78 are formed on the lower surface of the substrate 70. The substrate 70 is, for example, a semiconductor substrate such as a silicon substrate. The functional element 72 is, for example, an amplifier such as a low noise amplifier. The functional element 12 is, for example, a receive filter, and the low noise amplifier as the functional element 72 amplifies high-frequency signals output from the receive filter. Other structures are the same as those of the first embodiment, and the description thereof is thus omitted.

Figure 21:
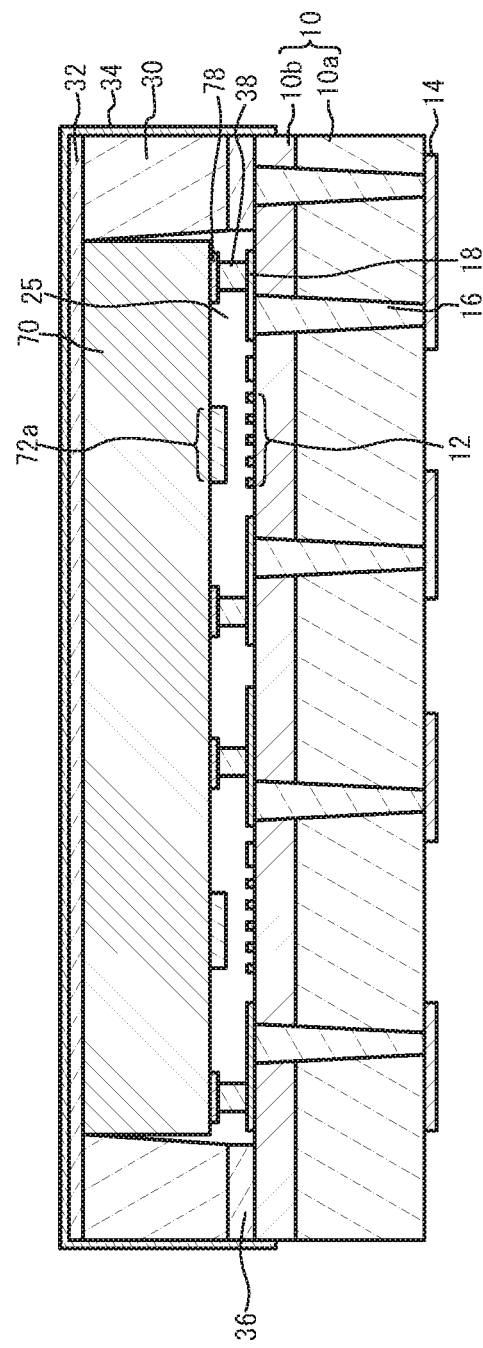
FIG. 21 is a cross-sectional view of an electronic device in accordance with a first variation of the fourth embodiment.

FIG. 21 is a cross-sectional view of an electronic device in accordance with a first variation of the fourth embodiment. As illustrated in FIG. 21, a plurality of filters or a plurality of duplexers as a plurality of the functional elements 12 are located on the substrate 10. The substrate 70 is flip-chip mounted. Functional elements 72a and the wiring lines 78 are located on the lower surface of the substrate 70. The substrate 70 is, for example, a semiconductor substrate such as a silicon substrate. The functional element 72a is, for example, a switch. The switch as the functional element 72a connects one of the plurality of filters or the plurality of duplexers as the functional elements 12 to an antenna, for example. Other structures are the same as those of the fourth embodiment, and the description thereof is thus omitted.

As in the fourth embodiment and the variation thereof, the functional element may be other than an acoustic wave resonator. For example, the functional element may be an active element such as an amplifier and/or a switch. Alternatively, the functional element may be a passive element such as an inductor and/or a capacitor. The first through fourth embodiments and the variations thereof have described an exemplary case where the first functional element and the second functional element face each other in the vertical direction, but it is only required that the first functional element and the second functional element are located across an air gap.

Although the embodiments of the present invention have been described in detail, it is to be understood that the various change, substitutions, and alterations could be made hereto without departing from the spirit and scope of the invention.

What is claimed is:

1. An electronic device comprising:
   a first substrate including a first functional element located on an upper surface of the first substrate;
   a second substrate that is flip-chip mounted on the upper surface of the first substrate through a bump, and includes a second functional element located on a lower surface of the second substrate; and
   a sealing member that is located on the upper surface of the first substrate, surrounds the second substrate in plan view, is not located between the first substrate and the second substrate, seals the first functional element and the second functional element so that the first functional element and the second functional element are located across an air gap,
   wherein the sealing member is bonded to the upper surface of the first substrate, is not bonded to the second substrate, and makes contact with an upper surface of the second substrate.

2. The electronic device according to claim 1, wherein the first substrate and the second substrate have different linear thermal expansion coefficients.

3. The electronic device according to claim 1, wherein the first functional element includes an acoustic wave element.

4. The electronic device according to claim 3, wherein the second functional element includes an acoustic wave element.

5. The electronic device according to claim 1, wherein the second substrate is bonded to the upper surface of the first substrate only through the bump.

6. The electronic device according to claim 1, wherein
   the sealing member includes a member that surrounds the second substrate in plan view and a lid that is located on the upper surface of the second substrate and an upper surface of the member, and
   the lid is not bonded to the upper surface of the second substrate, and is bonded to the upper surface of the member.

7. The electronic device according to claim 1, further comprising:
   a terminal located on a lower surface of the first substrate, and
   a wiring line connecting the terminal and the first functional element.

8. The electronic device according to claim 1, wherein the sealing member is made of metal.

9. The electronic device according to claim 1, further comprising:
   a transmit filter connected between a common terminal and a transmit terminal; and
   a receive filter connected between the common terminal and a receive terminal, wherein
   the first functional element includes the transmit filter, and the second functional element includes the receive filter.

10. An electronic device comprising:
    a first substrate including a first functional element located on an upper surface of the first substrate;
    a second substrate that is flip-chip mounted on the upper surface of the first substrate through a bump, and includes a second functional element located on a lower surface of the second substrate; and
    a sealing member that is located on the upper surface of the first substrate, surrounds the second substrate in plan view, is not located between the first substrate and the second substrate, seals the first functional element and the second functional element so that the first functional element and the second functional element are located across an air gap;
    a terminal located on a lower surface of the first substrate; and
    a via wiring connecting the terminal and the first functional element and penetrating through the first substrate, wherein
    the first substrate includes a sapphire substrate, and a lithium tantalate substrate or a lithium niobate substrate bonded to an upper surface of the sapphire substrate, and
    the first functional element includes an IDT located on an upper surface of the lithium tantalate substrate or the lithium niobate substrate.

11. An electronic device comprising:
    a first substrate including a first functional element located on an upper surface of the first substrate;
    a second substrate that is flip-chip mounted on the upper surface of the first substrate through a bump, and includes a second functional element located on a lower surface of the second substrate; and
    a sealing member that is located on the upper surface of the first substrate, surrounds the second substrate in plan view, is not located between the first substrate and the second substrate, seals the first functional element and the second functional element so that the first functional element and the second functional element are located across an air gap;

a terminal located on a lower surface of the first substrate; and
a wiring line connecting the terminal and the first functional element, and located on a side surface of the first substrate, wherein
the first substrate is a lithium tantalate substrate or a lithium niobate substrate, and
the first functional element includes an IDT located on an upper surface of the lithium tantalate substrate or the lithium niobate substrate.

* * * * *